(12) United States Patent
Tanaka et al.

(10) Patent No.: US 11,264,239 B2
(45) Date of Patent: Mar. 1, 2022

(54) POLARIZATION DEFINED ZERO MISALIGNMENT VIAS FOR SEMICONDUCTOR PACKAGING

(71) Applicant: Intel Corporation, Santa Clara, CA (US)

(72) Inventors: Hiroki Tanaka, Chandler, AZ (US); Aleksandar Aleksov, Chandler, AZ (US); Sri Ranga Sai Boyapati, Chandler, AZ (US); Robert A. May, Chandler, AZ (US); Kristof Darmawikarta, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/535,618

(22) Filed: Aug. 8, 2019

(65) Prior Publication Data

US 2019/0363059 A1    Nov. 28, 2019

Related U.S. Application Data

(62) Division of application No. 15/855,961, filed on Dec. 27, 2017, now Pat. No. 10,453,812.

(51) Int. Cl.
*H01L 21/027* (2006.01)
*H01L 23/00* (2006.01)
*H01L 23/485* (2006.01)

(52) U.S. Cl.
CPC ........ *H01L 21/0274* (2013.01); *H01L 23/485* (2013.01); *H01L 24/02* (2013.01);
(Continued)

(58) Field of Classification Search
CPC ..... H01L 21/0273–0279; H01L 21/312–3128; H01L 21/285–2885; H01L 24/02–09; H01L 23/48–485
See application file for complete search history.

(56) References Cited

U.S. PATENT DOCUMENTS 5,501,926 A    3/1996   Cheng et al.
6,163,367 A *  12/2000  Obszarny .................. G03F 1/29
                                                    355/53
(Continued)

OTHER PUBLICATIONS

Van, My Phung, "Polarization-Selective Optical Lithography, Proefschrift", Eindhoven University of Technology Library, 2014, ISBN 978-90-386-3760-0, 144 pages.

*Primary Examiner* — Laura M Menz
*Assistant Examiner* — Candice Chan
(74) *Attorney, Agent, or Firm* — Schwabe, Williamson & Wyatt P.C.

(57) ABSTRACT

Techniques that can assist with fabricating a semiconductor package that includes a zero misalignment-via (ZMV) and/or a trace formed using a polarization process are described. The disclosed techniques can result in creation of ZMVs and/or traces between the ZMVs using a process comprising application of polarized light to one or more resist layers (e.g., a photoresist layer, etc.). One embodiment of a technique includes modulating an intensity of light applied to one or more resist layers by interaction of a light source with a photomask and at least one polarizer such that one or more patterns are created on the one or more resist layers. One embodiment of another technique includes creating patterns on one or more resist layers with different types of polarized light formed from a photomask and at least one polarizer. The disclosed techniques can assist with reducing manufacturing costs, reducing development time, and increasing I/O density.

20 Claims, 7 Drawing Sheets

(52) U.S. Cl.
CPC ............... *H01L 2224/02311* (2013.01); *H01L 2224/02317* (2013.01)

(56) References Cited

U.S. PATENT DOCUMENTS

| | | | |
|---|---|---|---|
| 2010/0297398 A1* | 11/2010 | Sarma | ........................ G03F 1/50 428/156 |
| 2016/0183370 A1* | 6/2016 | Rawlings | ............. H05K 3/4647 174/257 |
| 2017/0005058 A1 | 1/2017 | Hurwitz et al. | |

\* cited by examiner

POLARIZATION DEFINED ZERO MISALIGNMENT VIAS FOR SEMICONDUCTOR PACKAGING

CROSS-REFERENCE TO RELATED APPLICATIONS

This application is a division of U.S. patent application Ser. No. 15/855,961, filed on Dec. 27, 2017, the entire contents of which is hereby incorporated by reference herein.

FIELD

Embodiments generally relate to semiconductor packages. More specifically, embodiments relate to techniques of fabricating a semiconductor package having at least one zero misalignment vertical interconnect access (ZMV) fabricated using a polarization process.

BACKGROUND INFORMATION

One of the main drivers for package design rules is the input/output (I/O) density per mm per layer (IO/mm/layer). The I/O density may be limited by the via pad sizes. However, current packaging technologies limit the extent to which the size of the via pads may be reduced.

Traditionally organic substrate manufacturing is performed utilizing semi-additive processing (SAP), with interconnections between layers made by laser drilling processes. Such interconnections include at least one vertical interconnect access (via) that includes a pad. Currently, via pads need to be relatively large due to the laser drilling processes used to create via openings through a dielectric layer above the via pads. Laser drilling is limited by the minimum feature size and the misalignment of the laser when drilling via openings. Some lasers, such as ultraviolet (UV) lasers, can reduce the via opening more than other types of lasers, but throughput is also greatly decreased.

As explained above, current laser drilling processes may result in creation of an alignment margin that causes a pad beneath a via to be larger than an opening of the via (via opening). This relatively large pad (when compared to the via opening) may limit the I/O density of a device, which may exacerbate difficulties associated with achieving I/O densities that are equal to or greater than 50 IO/mm/layer.

One alternative to the laser drilling processes described above is a process of fabricating a zero misalignment via (ZMV). The process of creating a ZMV (ZMV process) can be used to fabricate vias and pads that can increase I/O densities (when compared to the I/O densities achieved by laser drilling processes). The ZMV process method utilizes a photoresist layer with sensitivity to two different light wavelengths, two different light intensities, two different gray-scale masks, or a combination thereof. In this way, the photoresist layer can be differentially patterned in conjunction with a dose sensitive resist layer. This allows the vias and traces to be plated in a two-step process without removal of the photoresist layer. Consequently, the ZMV process can assist with avoiding any alignment impact on these layers. In the ZMV process, the line width and line spacing—that is, the pitch—is limited by the resolution of the exposure tool and the resist capability. Another approach of the ZMV process includes use of a dual color—i.e., a dual-tone resist that is sensitive to two distinct wavelengths. There are, however, some drawbacks to these approaches. Resist materials, such as liquid resists, are used for a ZMV process that uses a dual-tone resist. In addition, utilizing the previously discussed methods results in a via shape that is not well defined in the direction along the trace and this may have an effect on via's reliability.

BRIEF DESCRIPTION OF THE DRAWINGS

Embodiments described herein are illustrated by way of example and not limitation in the figures of the accompanying drawings, in which like references indicate similar features. Furthermore, in the figures, some details have been omitted so as not to obscure or convolute the inventive concepts described herein.

DETAILED DESCRIPTION

Figure 1A:
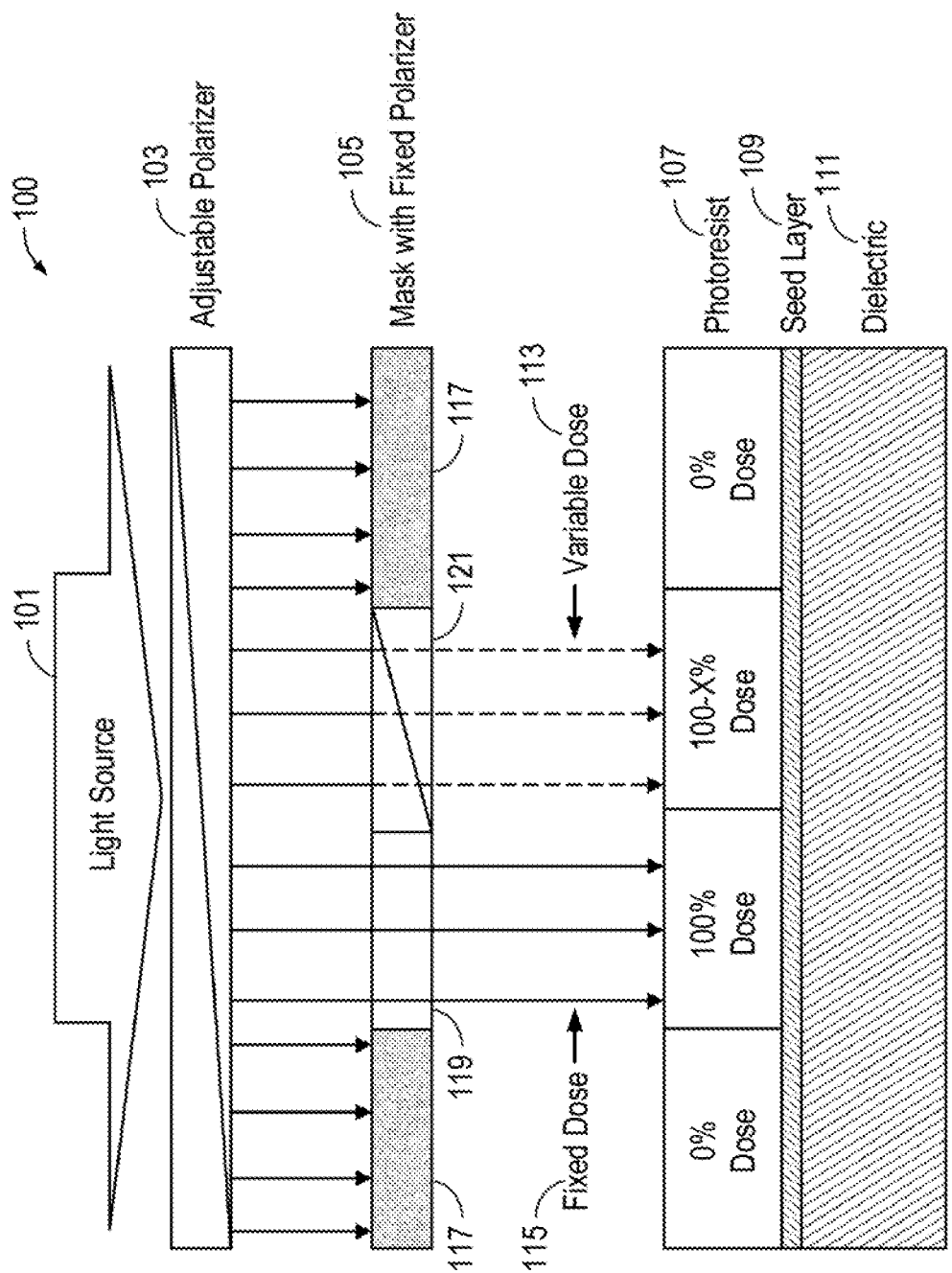
FIGS. 1A-1G are cross-sectional side view illustrations of a method of forming a package layer in a semiconductor package that includes at least one zero misalignment vertical interconnect access (ZMV) fabricated using a polarization process according to one embodiment.

Embodiments described herein provide techniques of fabricating a semiconductor package having at least one zero misalignment vertical interconnect access (ZMV) fabricated using a polarization process. That is, ZMVs and corresponding traces between the ZMVs are created using a process comprising application of polarized light to one or more resist layers (e.g., a photoresist layer, etc.).

In one embodiment, which may be referred to herein as a "polarization intensity modulation technique," an intensity of light incident on one or more resist layers is modulated by interaction of a light source with a photomask and at least one polarizer such that one or more patterns are created on the one or more resist layers. In another embodiment, which may be referred to herein as a "different polarization technique," patterns are created on one or more resist layers with different types of polarized light that is formed from unpolarized, mixed polarization, and/or randomly polarized light using from a photomask and at least one polarizer. For example, a first pattern is formed on one or more resist layers from a first type of polarized light that is processed by a photomask and at least one polarizer, while a second pattern is formed on the one or more resist layers from a second type of polarized light that is processed by a photomask and at least one polarizer. For this example, the first type of polarized light is parallel to an incident surface of the one or more resist layers and the second type of polarized light is perpendicular to the incident surface of the one or more resist layers. Also, and for this example, the different types of polarized light may be incident on the one or more resist layers (e.g., an anisotropic photoresist layer, etc.), which would cause the one or more resist layers to respond differently depending on the incident polarization.

In specific embodiments, each of the techniques described above (e.g., the polarization intensity modulation technique, the different polarization technique, etc.) result in creation of two patterns on the one or more resist layers (e.g., a photoresist layer, etc.). Following exposure operations performed on the one or more resist layers (e.g., a photoresist layer, etc.), a first pattern of the two patterns is developed and then a first layer formed from a conductive material (e.g., copper (Cu), etc.) is deposited. This first layer will eventually form a ZMV. Next, a second pattern of the two patterns is developed and plated to form the ZMV and a trace. The two patterns are formed with a photomask and, as a result, no pads are formed in a semiconductor package formed using the embodiments described herein. As explained above, the photomask receives light that passes through at least one polarizer.

Numerous advantages result from embodiments of the techniques described herein. These advantages provide benefits over some currently available techniques for fabricating ZMVs and traces. Examples of these currently available techniques include, but are not limited to, using a dose selective dual development approach with an intensity modulating mask and using a dual-tone/wavelength approach with a color/wavelength selective mask.

One advantage is that embodiments of the polarization techniques described herein includes using polarized light to increase the width of the ZMV process window, which in turn, can assist with improving a high degree of repeatability (i.e., yield). In a currently available technique that involves use of a dual dose mask, the mask has a different transparency of light for vias and traces, which in turn leads to differential dosing of the one or more resist layers. This currently available technique, however, has a drawback because the doses of light passing through the dual dose mask cannot be changed after the mask has been created. As a result of this drawback, the currently available techniques that involve use of a dual dose mask limits flexibility in the manufacturing process. This is because any inadvertent changes in the intensity of the light source can lead to unwanted changes in the structures (e.g., ZMVs, traces, etc.) being manufactured. Embodiments of the polarization techniques described herein can assist with minimizing or eliminating the limitation associated with the dual dose mask. For example, an embodiment of the polarization intensity modulation technique includes use of an adjustable polarizer (e.g., a circular polarizer, a linear polarizer, a combination thereof, etc.) that is placed between the light source and a photomask, as described in further detail below. This adjustable polarizer can, in some embodiments, assist with monitoring and modulating an intensity of light passed through the photomask during the manufacturing process, which can in turn assist with providing increased flexibility and control over the manufacturing process. This increased flexibility and control can in turn assist with improving both the quality of the two patterns and the amount of yield. In this way, one or more of the embodiments described herein can assist with reducing manufacturing costs, reducing development time of fabricating a semiconductor package, and with increasing the I/O density in a semiconductor package.

Embodiments of the polarization techniques described herein can also assist with overcoming one or more limitations associated with dual wavelength lithography. Specifically, dual wavelength lithography includes using a dual wavelength absorbing resist together with an exposure tool that can filter and/or enable different wavelengths. Using a dual wavelength absorbing resist together with an exposure tool can complicate photoresist and lithography tool development. In contrast, embodiments of the polarization techniques described herein include use of a photomask, at least one polarizer, and one or more resist layers that can be readily integrated into existing exposure tools without changing the lens configuration or light source. Additionally, embodiments of the polarization techniques described herein include use of one or more polarization-selective photoresist layers, which can assist enabling improved contrast over currently available techniques that include use of dual patterning techniques. Embodiments of the polarization-selective photoresist layers described herein can be created by incorporation of dichroic photoinitiator materials that allow polarized light to participate polymerization. Embodiments of the resist layers described herein can assist with enhancing the patterning resolution when propagation of the polarized light has a predetermined directional alignment, a predetermined critical dimension, and a high numerical aperture (NA) to capture higher diffraction orders.

In addition, illumination areas that can be achieved with embodiments of the polarization techniques described herein (e.g., the different polarization technique, etc.) provide an advantage over some currently available techniques. This is because as the illumination areas achieved with embodiments of the polarization techniques described herein can be larger than those achieved by currently available techniques, which can in turn assist with improving can assist with reducing manufacturing costs and reducing development time of fabricating a semiconductor package, and with increasing the I/O density in a semiconductor package.

FIGS. 1A-1F are cross-sectional side view illustrations of a method of forming a package layer 100 in a semiconductor package that includes at least one ZMV fabricated using a polarization process according to one embodiment. The polarization process shown in FIGS. 1A-1F can be one or more of: (i) a polarization intensity modulation technique, as described above; and (ii) a different polarization technique, as described above.

With regard now to FIG. 1A, where a method of forming a package layer 100 begins. As shown, the package layer 100 comprises a photoresist layer 107 on a seed layer 109 on a dielectric layer 111. The dielectric layer 111 may reside on a substrate core (not shown). Persons having ordinary skill in the art will appreciate that the substrate core is not shown or described to avoid obscuring or convoluting embodiments of the inventive concepts described herein.

In one embodiment, the dielectric layer 111 may be formed, for example, from thermal or native growth of silicon dioxide on the surface of a crystalline silicon substrate and/or using a bumpless build-up layer (BBUL) process with a material such as, for example, a polymer. One example of a suitable material is a polymeric epoxy film known as Ajinomoto Build-up Film (ABF), available from Ajinomoto Fine-Techno Company, Inc. The dielectric layer 111 can be deposited using one or more suitable dielectric deposition techniques, e.g., electroless plating or any other dielectric layer deposition technique known to one of ordinary skill in the art of electronic device manufacturing.

In one embodiment, the seed layer 109 is a conductive seed layer. Examples of the conductive materials that may be used for the seed layer include, but are not limited to, metals, e.g., copper, tungsten, tantalum, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof. In more specific embodiments, the seed layer 109 is a copper layer. The seed layer 109 can be deposited using one or more conductive layer deposition techniques, e.g., electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing.

In one embodiment, the photoresist layer 107 is formed from a positive tone photoresist that is a dual-tone photoresist. For one example, the photoresist comprises a polymer, a photoactive agent, and a dissolution inhibitor. In a positive tone photoresist, the area exposed to the radiation or light will define the area where the photoresist will be removed. Generally, a dual-tone photoresist allows printing of two images in an exposure of a photomask (e.g., photomask 105, etc.). In one embodiment, the photoresist layer 107 comprises materials that react differently to different light wavelengths, different light intensities, or both. In one embodiment, the photoresist layer 107 is a dual-tone, wavelength selective photoresist. In another embodiment, the photoresist layer 107 is a dual-tone, dose selective photoresist. In one embodiment, the photoresist layer 107 contains a bis-azide added to a positive-tone resist containing a diazoketone dissolution inhibitor. In another embodiment, the photoresist layer 107 comprises a positive photosensitizer, a negative photosensitizer, a polymeric matrix resin, or any combination thereof. In another embodiment, the photoresist layer 107 comprises a photo-acid and/or photo-base generator and a chemically amplified photoresist. In one embodiment, the photoresist layer 107 is deposited using a dry film process. In another embodiment, the photoresist layer 107 is deposited by application of a solution using for example, a spin-coating, a slit-coating, a spray-coating, or any other coating technique, or any other photoresist depositing techniques known to one of ordinary skill in the art of electronic device manufacturing. The photoresist layer 107 may be patterned to form metal features. Generally, a semi-additive metallization process involves forming a photoresist mask that defines the regions on the photoresist layer 107 where metal features are formed later on in a process.

As shown in FIG. 1, the photoresist layer 107 is exposed to a light 101 through an adjustable polarizer 103 and a photomask 105 to pattern at least two images at a time. In one embodiment, the light 101 comprises un-polarized light or light having mixed polarization. In one embodiment, the light 101 passes through the adjustable polarizer 103 before passing through the photomask 105. The adjustable polarizer 103 filters the light 101 such that some of the light 101 having a particular spatial characteristic, frequency (wavelength), phase, and/or polarization state passes through the adjustable polarizer 103 to the photomask 105, while the rest of the light 101 is prevented from passing through the adjustable polarizer 103 to the photomask 105. In one embodiment, the adjustable polarizer 103 can comprise one or more linear polarizers, one or more circular polarizers, or a combination thereof. Furthermore, the adjustable polarizer 103 can be adjusted such that portions of the light 101 having a particular spatial characteristic, frequency (wavelength), phase, and/or polarization state may be filtered. For example, the adjustable polarizer 103 can be adjusted at a first time such that portions of the light 101 having a first particular spatial characteristic, frequency (wavelength), phase, and/or polarization state may pass through the polarizer 103 to the photomask 105. Also, and for this example, the adjustable polarizer 103 can be adjusted at a second time (that differs from the first time) such that portions of the light 101 having a second particular spatial characteristic, frequency (wavelength), phase, and/or polarization state (that differs from the first particular spatial characteristic, frequency (wavelength), phase, and/or polarization state) may pass through the polarizer 103 to the photomask 105.

In one embodiment, the polarized light 101 that passes through the adjustable polarizer 103 travels to the photomask 105 by way of a series of optical elements. In one embodiment, the image formed by passage of the polarized light 101 through the photomask 105 is projected onto the photoresist layer 107 by way of a series of optical elements. In one embodiment, the size of the projected field and the images thereon is reduced or magnified in size compared to the mask field. In one embodiment, the polarized light 101 is generated by a broadband light source (not shown). In yet another embodiment, the polarized light 101 is generated by a plurality of wavelength light sources. The photomask 105 comprises at least three regions, e.g., an open region 119, a polarized region 121, and two closed regions 117.

In one embodiment, the polarized light 101 comprises multiple wavelengths in one or more wavelength ranges. In one embodiment, a polarization intensity modulation technique is used to pattern the photoresist layer 107. Here, different portions of the photomask 105 transmit different doses of the polarized light 101. In this embodiment, the photomask 105 comprises one or more grayscale masks, so that different regions of the photomask 105 transmit different doses of the polarized light 101. These different regions of the photomask 105 allow multi-patterning of photoresist layer 107 due to varying amounts of intensity of the polarized light 101. In one embodiment, the open region 119 transmits a fixed dose 115 (e.g., one or more first intensities or doses of the polarized light 101), the polarized region 121 transmits a variable dose 113 (e.g., one or more second intensities or doses of the polarized light 101), and the closed regions 117 are opaque to the polarized light 101. In one embodiment, the open region 119 is transparent to the polarized light 101, the closed regions 117 are opaque to the polarized light 101, and the polarized region 121 is also transparent to the polarized light 101.

In one embodiment, a different polarization technique is used to pattern the photoresist layer 107. This technique includes utilizing different types of polarized light to pattern the photoresist layer 105. In one embodiment, this technique uses linearly polarized light 101, a photomask 105 with a polarized region 121 formed from a polarization filter, and a photoresist layer 107 formed from polarization-selective resist materials. In one embodiment, the linearly polarized light 101 comprises transversely polarized light and longitudinally polarized light. Transversely polarized light can be created by one or more linear polarizers, which are known so they are not described in detail herein. Generating longitudinally polarized light may include use of more or different optical components than the optical components used for generating transversely polarized light. Additional details about embodiments of the different polarization technique are provided below in connection with FIGS. 2A-2G.

The materials for the photomask 105 are selected based on the optical properties. In one embodiment, photomask 105 comprises fused silica, glass, chromium, a polymer, a multilayer dielectric interference filter, a spin-on glass of inorganic oxide, or any combination thereof.

As explained above, the photomask 105 includes a polarized region 121. The polarized region 121 may comprise one or more linear polarizers, one or more circular polarizers, or a combination thereof. In one embodiment, the polarized region 121 is designed such that portions of the light 101 having a specified or fixed spatial characteristic, frequency (wavelength), phase, and/or polarization state may pass through the polarized region 121.

In one embodiment, the polarized region 121 and the adjustable polarizer 103 are used in combination to control or vary an intensity of the light 101 transmitted through the photomask 105 based on a function of an incident polarization state. One benefit of varying an intensity of the light 101 based on a function of an incident polarization state is that the intensity of the light 101 that is transmitted onto the photoresist layer 107 may be finely tuned and adjusted in an improvised or extemporaneous manner (i.e., "on-the-fly"). In one embodiment, an intensity meter (not shown in FIG. 1A) monitors the intensity of the light 101 before and during the transmission onto the photoresist layer 107. The monitored information may then be provided to the adjustable polarizer 103, which would then compensate for intensity fluctuations. In this way, the photoresist layer 107 receives much lower dose fluctuations and, as a result, a much more accurate or tighter process window can be achieved (as opposed to the less accurate process windows associated with one or more currently available techniques of forming ZMVs and traces). In this way, the use of the adjustable polarizer 103 and the polarized region 121 can assist with reducing the development time and increasing the quality associated with fabrication of ZMVs and traces. Moreover, use of the adjustable polarizer 103 and the polarized region 121 can assist with increasing repeatability of the process by reducing fluctuations in doses of the light 101.

Referring again to FIG. 1A, the light 101 passing through the photomask 105 results in creation of two patterns on the photoresist layer 107. The first pattern is created using the full dose/intensity of the light 101 (i.e., 100% of the dose of the light 101) in an area of the photoresist layer under the open region 119 of the photomask 105. The second pattern is created using the less than the full dose/intensity of the light 101 (i.e., less than 100% of the dose of the light 101) in an area of the photoresist layer under the polarized region 121 of the photomask 105.

Figure 1B:
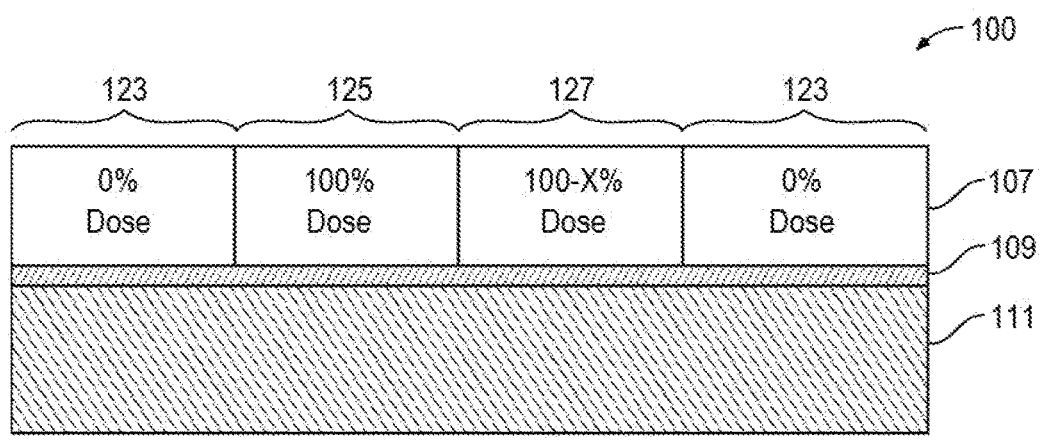

Referring now to FIG. 1B, which illustrates the package layer 100 after the photoresist layer 107 is exposed to the light 101 according to one embodiment. Following exposure to the light 101 through the photomask 105 and the adjustable polarizer 103, the photoresist layer 107 undergoes chemical responses that vary according to the exposure in the various regions of the resist. As shown in FIG. 1B, after the exposure, at least three two dimensional (2D) regions in the photoresist layer 107 are created, e.g., two regions 123, a region 125, and a region 127. In one embodiment, the region 125 represents a 2D image of a first feature (e.g., a via, or any other feature) to be formed on the dielectric layer 111; the region 127 represents a 2D image of a second feature (e.g., a trace, or any other feature adjacent to the first feature) to be formed on the dielectric layer 111. The region(s) 123 are used to protect portions of the seed layer 109 on the dielectric layer 111 from exposure. That is, at least two images of the features are created at the same time. Generally, the number of patterned regions, such as regions 123, 125 and 127, created is determined by the photoresist chemistry. In alternative embodiments, additional regions in addition to regions 123, 125 and 127 are created to pattern more than two images at a time.

As shown in FIG. 1B, each of the created regions 123, 125 and 127 has been exposed to different doses of the polarized light 101. In a non-limiting example, region(s) 123 have not been exposed to the polarized light 101; region 125 has been exposed to light having one intensity or dose (e.g., 100% of light 101); and region 127 has been exposed to light having an intensity or dose different from the intensity or dose of the light to which region 125 has been exposed (e.g., less than 100% of light 101). In one non-limiting example, a region 125 is a base-soluble portion of the photoresist layer 107; regions 123 are unexposed portions of the photoresist layer 107; and region 127 is a cross-linked portion of the photoresist layer 107.

Figure 1C:
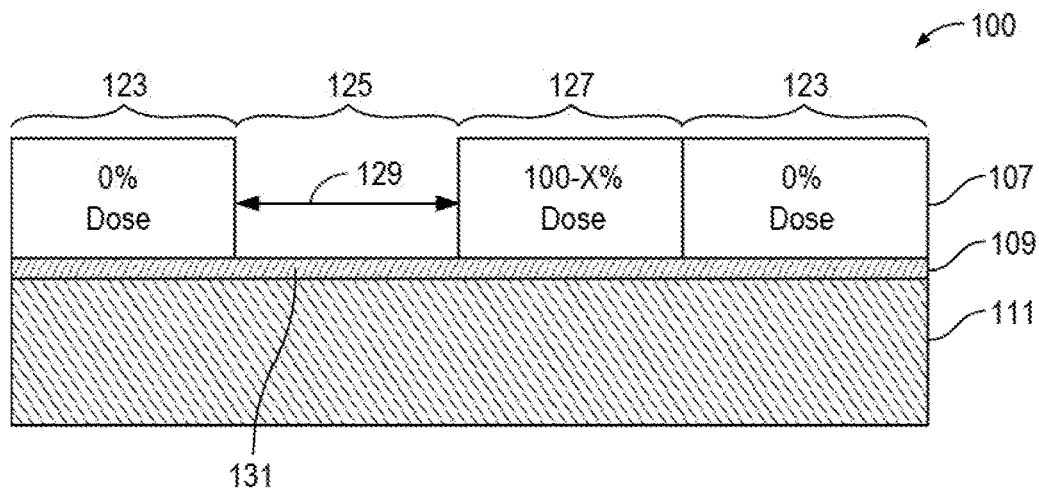

Referring now to FIG. 1C, which illustrates the package layer 100 after the region 125 of the photoresist layer 107 has been removed to uncover a top side of the seed layer 109 according to one embodiment. In one embodiment, region 125 is selectively removed by dissolution in an aqueous basic developer solution, while leaving regions 123 and 127 intact. In a specific embodiment, region 125 becomes soluble in an aqueous basic developer solution, while other regions (e.g., regions 123 and 127) remain insoluble, either due to a presence of a dissolution inhibitor (e.g., region 123, which is unexposed) or due to cross-linking (e.g., region 127). In alternative embodiments, region 125 is selectively removed using other photoresist removal techniques known to one of ordinary skill in the art of electronic device manufacturing (e.g., a dry etch technique, etc.). In one embodiment, one or more features to be formed in the region 125 comprise a via-pad structure (also referred to herein as a ZMV). In one embodiment, the soluble region 125 is selectively removed to form one or more openings, e.g., an opening 129, to expose one or more portions of the seed layer 109, e.g., a portion 131, while leaving regions 123 and 127 intact to form one or more ZMVs later on in the process. Opening 129 can have a circular, oval, elliptical, square, rectangular, or any other shape.

Figure 1D:
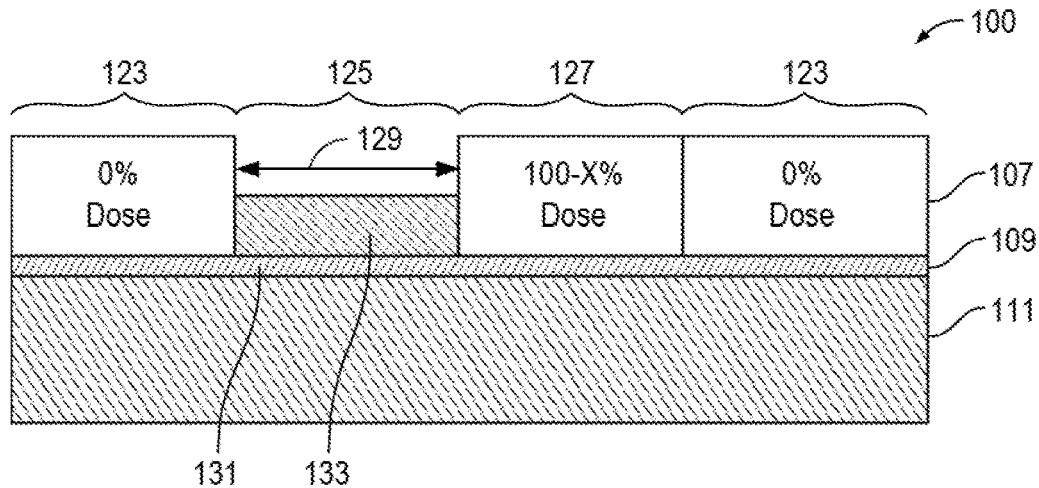

With regard now to FIG. 1D, which illustrates the package layer 100 after a first conductive layer 133 is deposited onto the uncovered top side of a portion 131 of the seed layer 109 according to one embodiment. In one embodiment, a first conductive layer 133 is a part of a via-pad structure. Examples of the conductive materials that may be used for the conductive layer include, but are not limited to, metals, e.g., copper, tungsten, tantalum, titanium, hafnium, zirconium, aluminum, silver, tin, lead, metal alloys, metal carbides (e.g., hafnium carbide, zirconium carbide, titanium carbide, tantalum carbide, aluminum carbide), other conductive materials, or any combination thereof. In more specific embodiment, the conductive layer 133 is a copper layer. In one embodiment, a thickness of the first conductive layer 133 is determined by both the height of the via and the thickness of a trace adjacent to the via. In one embodiment, a thickness of the first conductive layer 133 is smaller than the thickness of the photoresist layer 107. In one embodiment, a thickness of the first conductive layer 133 corresponds to a difference between the height of the via and thickness of the metal line adjacent to the via.

As shown in FIG. 1D, the conductive layer 133 is deposited while leaving portions 123 and 127 of the photoresist layer 107 intact. In one embodiment, the conductive layer 133 is deposited using one of electroplating techniques known to one of ordinary skill in the art of electronic device manufacturing. In more specific embodiment, conductive layer 133 is deposited by an electrolytic plating technique at conditions such that the electrolytic plating does not dissolve any of the remaining portions 123 and 127 of the photoresist layer 107, e.g., a solution of copper (II) sulfate and sulfuric acid at room temperature, used for depositing copper. In alternative embodiments, the conductive layer 133 is deposited using one of conductive layer deposition techniques, e.g., electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing.

Figure 1E:
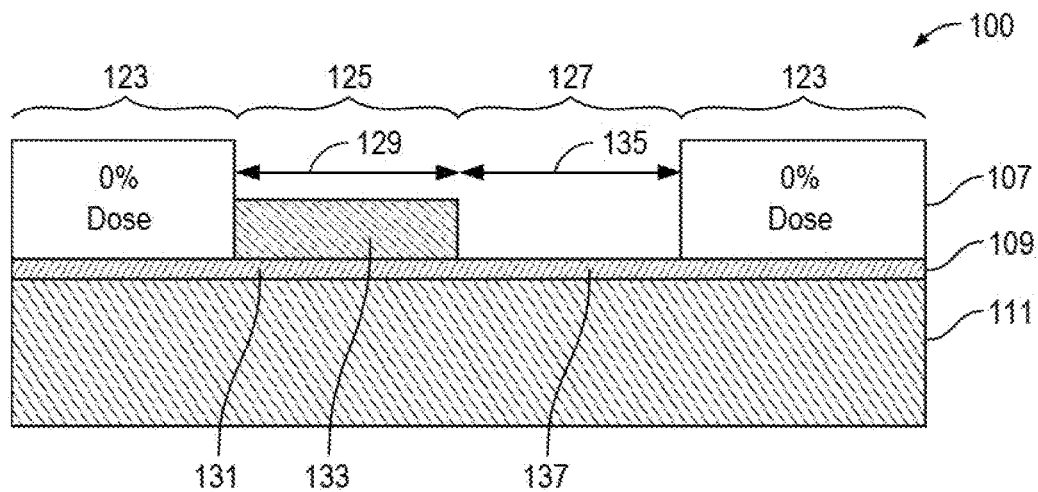

Referring now to FIG. 1E, which illustrates the package layer 100 after a region 127 of the photoresist layer 107 is removed to uncover a portion 137 of the seed layer 109 according to one embodiment. In one embodiment, one or more features formed on the portion 137 of the seed layer 109 comprise a trace. As shown in FIG. 1E, the region 127 is selectively removed to form one or more open regions, such as open region 135, to expose one or more portions, such as a portion 137 of the seed layer 109 while leaving regions 123 of the photoresist layer 107 and conductive layer 133 intact. As shown in FIG. 1E, the conductive layer 133 is bounded by a top surface and a sidewall surface. The sidewall surface of the conductive layer 133 is exposed by removal of the region 127 of the photoresist layer 107. In one embodiment, region 127 is selectively removed by dissolution in an appropriate solvent that is not a solvent for other remaining regions 123 of the photoresist layer 107. In one embodiment, the region 127 is removed directly after conductive layer 133 is deposited. In another embodiment, the region 127 is treated with an additional exposure, e.g., a flood exposure, heating, or contact with a chemical (which can include the chemicals used during electrolytic plating of the conductive layer 127), to effect a change in the solubility and improve solubility selectivity. In a more specific embodiment, the treated region is removed by dissolution in an organic solvent or, in another embodiment, by dissolution by an aqueous base solution. In one embodiment, the additional treatment of the region 127 is performed before electrolytic plating of the conductive layer 133. In another embodiment, the additional treatment of the region 127 is performed during electrolytic plating of the conductive layer 133. In yet another embodiment, the additional treatment of the region 127 is performed after electrolytic plating of the conductive layer 133. In alternative embodiments, region 127 is selectively removed using other photoresist removal techniques known to one of ordinary skill in the art of electronic device manufacturing. In one embodiment, the width of the openings 135 is determined by design, e.g., by the width of the trace formed later on in the process. In one embodiment, the length of the opening 135 is determined by design, e.g., by the length of the trace formed later on in a process.

Figure 1F:
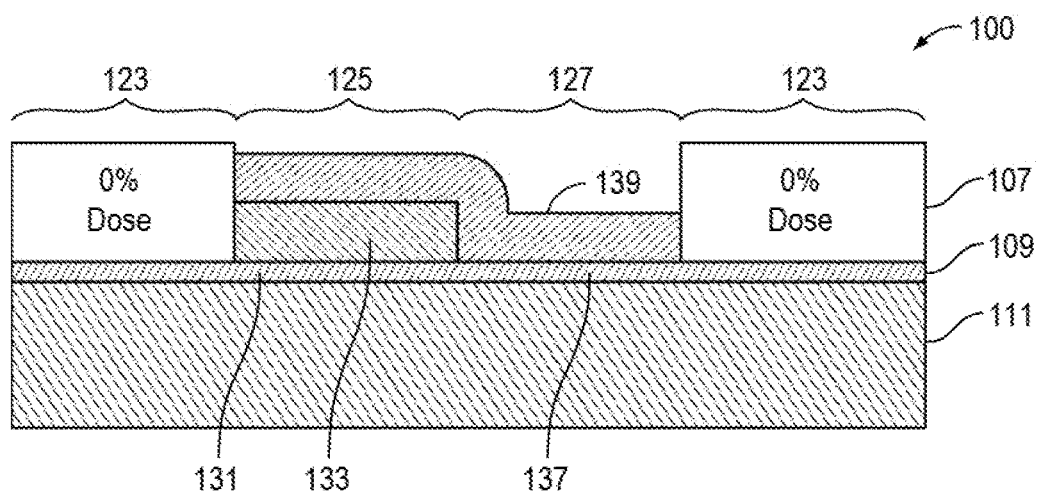

With regard now to FIG. 1F, which illustrates the package layer 100 after a second conductive layer 139 is deposited onto the first conductive layer 133 and the exposed portion 137 of the seed layer 109 according to one embodiment. As shown in FIG. 1F, a second conductive layer 139 is deposited onto the portions 137 and simultaneously on top of a first conductive layer 133. The second conductive layer 139 comprises three portions. A first portion of the second conductive layer 139 forms one or more traces. A second portion of the second conductive layer 139 is deposited directly on top of first conductive layer 133. A third portion of the second conductive layer 139 forms a transition region between the first and second portions of the second conductive layer 139. Examples of the conductive materials that may be used for the second conductive layer 139 include, but are not limited to, metals, e.g., copper, tungsten, tantalum, titanium, hafnium, zirconium, aluminum, silver, tin, lead, metal alloys, metal carbides (e.g., hafnium carbide, zirconium carbide, titanium carbide, tantalum carbide, aluminum carbide), other conductive materials, or any combination thereof. In more specific embodiments, the second conductive layer 139 is a copper layer. In one embodiment, a thickness of the second conductive layer 139 is determined by the thickness of the trace and is approximately equal in the first and second portions of the second conductive layer 139. In one specific embodiment, the second conductive layer 139 is deposited in an isotropic process. In an alternative embodiment, the second conductive layer 139 is deposited in an anisotropic process.

As shown in FIG. 1F, the second conductive layer 139 is deposited while leaving portions 123 of the photoresist layer 107 intact. In one embodiment, the second conductive layer 139 is deposited using one of electroplating techniques known to one of ordinary skill in the art of electronic device manufacturing. In a more specific embodiment, the second conductive layer 139 is deposited by an electrolytic plating technique at the conditions such that the remaining portions 123 of the photoresist layer 107 is not dissolved, e.g., by immersion into a solution of copper (II) sulfate and sulfuric acid at room temperature, used for depositing copper. In alternative embodiments, the second conductive layer 139 is deposited using one of conductive layer deposition techniques, e.g., electroless plating, electroplating, sputtering, chemical vapor deposition (CVD), metalorganic chemical vapor deposition (MOCVD), atomic layer deposition (ALD), or any other conductive layer deposition technique known to one of ordinary skill in the art of electronic device manufacturing.

In FIG. 1F, the first conductive layer 133 and the second portion of the second conductive layer 139 (as described above) collectively form a via-pad structure, such a ZMV with a pad. The lower portion of the via-pad structure, extending from the top of seed layer 109 up to the top of the first portion of the second conductive layer 139 forms a pad. The upper portion of the via-pad structure, extending from the top of the pad to the top of the second portion of the second conductive layer 139, represents a via (e.g., a ZMV, etc.). In one embodiment, a height of the pad is less than or equal to a height of the via, in which case the pad and the via each comprise portions of the first conductive layer 133 and the second conductive layer 139. In an alternative embodiment, the height of the pad is greater than the height of the via, in which case the pad comprises portions of the first conductive layer 133 and the second conductive layer 139, while the via comprises the second conductive layer 139 only. In one embodiment, the first and second portions of the second conductive layer 139 are adjacent along only one direction, and the third, transition portion of the second conductive layer 139 extends only in one direction between the first and second portions of the second conductive layer 139. In an alternative embodiment, the first and second portions of the second conductive layer 139 are adjacent along multiple directions, and the third, transition portion of the second conductive layer 139 extends in multiple directions between the first and second portions of the second conductive layer 139.

In one embodiment, where the photoresist layer 107 comprises more than three patterned regions, the remaining patterned regions are developed and a conductive layer is deposited in a manner similar to the manner described with respect to FIGS. 1A-1F. Generally, deposition of the conductive layer is additive, so each successive conductive layer deposition operation adds to the height of all uncovered conductive structures.

Figure 1G:
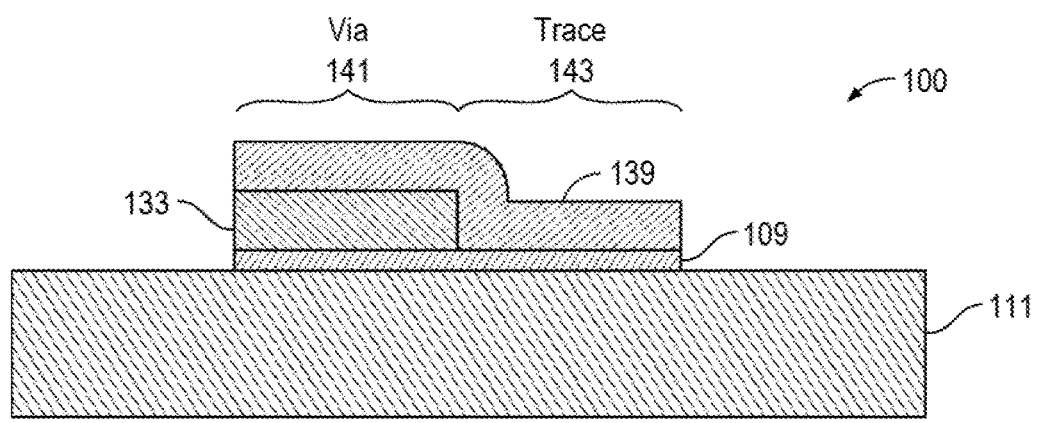

With regard now to FIG. 1G, which illustrates the package layer 100 after regions 123 of the photoresist layer 107 and portions of the seed layer 109 are removed to uncover one or more portions of the dielectric layer 111 according to one embodiment. The regions 123 are removed to expose underlying portions of the seed layer 109. Subsequently, the underlying portions of the seed layer 109 are removed to define a metal pattern. In one embodiment, the regions 123 of the photoresist layer 107 are removed by using one of a stripping solution, an ashing, an etching technique, or any other photoresist removal technique known to one of ordinary skill in the art of electronic device manufacturing. In one embodiment, the underlying portions of the seed layer 109 are removed using one of a wet etching, dry etching, or both dry and wet etching techniques known to one of ordinary skill in the art of electronic device manufacturing. As shown in FIG. 1G, the via-pad structure formed from the conductive layers 133 and 139 comprise a via portion 141 and a trace portion 143. In one embodiment, dimensions of the via portion 141 are at least approximately similar in all directions other than the direction of trace portion 143. In this way, a zero misalignment via (ZMV) 141 is advantageously achieved. As shown in FIG. 1G, the ZMV 141 does not effectively include a pad. This is because it is effectively eliminated, as the extent of the pad portion in all directions other than the direction of the trace 143 is reduced to the extent of the via portion 141. In one embodiment, a width of the pad portion (not shown FIG. 1G) is at least approximately the same as the width of the via portion 141 and the width of the trace 143. For one embodiment, a length of the trace 143 attached to the via 141 is at least approximately greater than the width of the pad. In one non-limiting example, forming ZMV structures 141 and the trace 143 assist with increasing the I/O density of 10 connections to about 250/mm/layer.

FIGS. 2A-2G are cross-sectional side view illustrations of a method of forming a package layer 400 in a semiconductor package that includes at least one ZMV fabricated using a polarization process according to yet another embodiment. The polarization process shown in FIGS. 2A-2G can be similar to or the same as a different polarization technique, as described above.

Figure 2A:
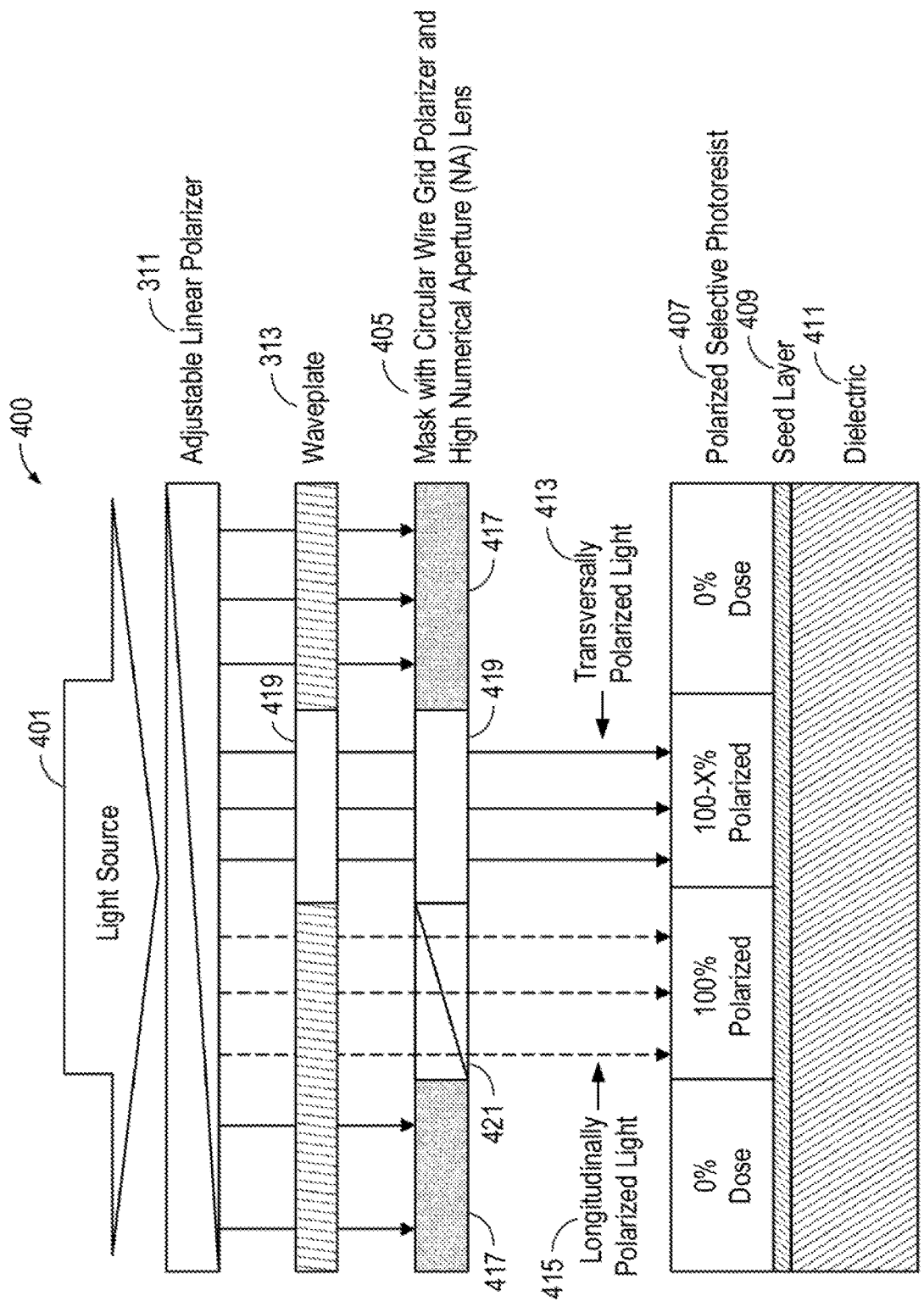
FIGS. 2A-2G are cross-sectional side view illustrations of a method of forming a package layer in a semiconductor package that includes at least one ZMV fabricated using a polarization process according to another embodiment.

With regard now to FIG. 2A, where a method of forming a package layer 400 begins. As shown, the package layer 400 comprises a photoresist layer 407 on a seed layer 409, where the seed layer 409 is on a dielectric layer 411. The dielectric layer 411 may reside on a substrate core (not shown). Persons having ordinary skill in the art will appreciate that the substrate core is not shown or described to avoid obscuring or convoluting embodiments of the inventive concepts described herein.

The dielectric layer 411 is similar to or the same as the dielectric layer 111, so it is not described again for brevity. The seed layer 409 is similar to or the same as the seed layer 109, so it is not described again for brevity.

In one embodiment, the photoresist layer 407 is similar to or the same as the photoresist layer 107, so it is not described again for brevity. In a further embodiment, the photoresist layer 407 comprises a polarization-selective photoresist material. That is, the photoresist layer 407 is selectively sensitive to longitudinally polarized light and transversely polarized light. In a specific embodiment, the photoresist layer 407 is more sensitive to longitudinally polarized light than to transversely polarized light.

As shown in FIG. 2A, the photoresist layer 407 is exposed to a light 401. In one embodiment, the light 401 passes through an adjustable linear polarizer 311, a waveplate 313, and a photomask 405 (comprising a circular wire grid polarizer and a high NA lens) to pattern at least two images at a time on the photoresist layer 407. The adjustable linearly polarizer 311 processes light (e.g., randomly polarized, un-polarized light, etc.) to generate linearly polarized light. In one embodiment, this linear polarizer 311 may be part of the adjustable polarizer 103 or the polarized region 121 of the photomask 105 (which are both described above in connection with FIGS. 1A-1G).

FIG. 2A also includes processing of the linearly polarized light by a waveplate 313 (e.g., a half-wave plate, quarter-wave plate, a combination thereof, etc.) to generate circular polarized light. When the waveplate 313 includes a half-wave plate, the half-wave plate shifts the polarization direction of linearly polarized light. When the waveplate 313 includes a quarter-wave plate, it converts the linearly polarized light into circularly polarized light. The waveplate 313 can be formed from a birefringent material (e.g., quartz, mica, etc.) for which the index of refraction is different for different orientations of the linearly polarized light passing through it. The behavior of the waveplate 313 depends on the thickness of the crystal, the wavelength of the linearly polarized light, and the variation of the index of refraction. By appropriate choice of the relationship between these parameters, it is possible to introduce a controlled phase shift between the two polarization components of a light wave, thereby altering its polarization. In one embodiment, the controlled phase shift introduced by the waveplate 313 is $\pi/2$.

The photomask 405 may include a circular wire grid polarizer (WGP) and a high NA lens. The output of the wavelet 313 can be passed to the circular polarized light, which processes the received output to generate radially polarized light. The circular WGP comprises several fine parallel metallic wires that are placed in a plane that mostly reflect non-transmitted polarization and can thus be used as a polarizing beam splitter.

After generation of the radially polarized light, a high NA lens processes the radially polarized light that is output by the circular WGP to generate longitudinally polarized light. This light is parallel to the direction of light propagation.

In one embodiment, the light 401 comprises un-polarized light, mixed polarization light, or the randomly polarized light described above in connection with one or more of FIGS. 1A-1G. In one embodiment, the adjustable linear polarizer 311 processes the light 401 to generate transversely polarized light 413, as described above. This light 413 is then passed to the waveplate 313, which processes the transversely polarized light 413 to generate circular polarized light, as described above. The circular polarized light may be passed to the photomask 405, which processes the circular polarized light to generate longitudinally polarized light 415, as described above. In one embodiment, each of the waveplate 313 and the photomask 405 includes a region 419 that allows the transversely polarized light 413 to reach the photoresist layer 407 and dose a portion of the photoresist layer 407. In one embodiment, the photomask 405 also includes a region 421 comprising a circular wire grid polarizer and a high NA lens, as described above. The photomask 405 also includes closed regions 417 which are similar to or the same the closed regions 117 described above in connection with FIG. 1A, so they are not described again for brevity.

The adjustable linear polarizer 311 filters the light 401 such that some of the light 401 having a particular spatial characteristic, frequency (wavelength), phase, and/or polarization state passes through the adjustable linear polarizer 311 to the waveplate 313 and the photomask 405, while the rest of the light 401 is prevented from passing through the adjustable linear polarizer 311. In one embodiment, the adjustable linear polarizer 311 can comprise one or more linear polarizers. Furthermore, the adjustable linear polarizer 311 can be adjusted such that portions of the light 401 having a particular spatial characteristic, frequency (wavelength), phase, and/or polarization state may be filtered. For example, the adjustable linear polarizer 311 can be adjusted at a first time such that portions of the light 401 having a first particular spatial characteristic, frequency (wavelength), phase, and/or polarization state may pass through the polarizer 311 to the waveplate 313 and the photomask 405. Also, and for this example, the adjustable linear polarizer 311 can be adjusted at a second time (that differs from the first time) such that portions of the light 401 having a second particular spatial characteristic, frequency (wavelength), phase, and/or polarization state (that differs from the first particular spatial characteristic, frequency (wavelength), phase, and/or polarization state) may pass through the polarizer 311 to the waveplate 313 and the photomask 405.

In one embodiment, the polarized light 401 comprises multiple wavelengths in one or more wavelength ranges. In one embodiment, a different polarization technique is used to pattern the photoresist layer 407. Here, different portions of the photomask 405 transmit doses of different types of polarized light to the photoresist layer 401. The different types of polarized light include: (i) transversally polarized light 413; and (ii) longitudinally polarized light 415. In this embodiment, the photomask 405 comprises an open region 419, a polarized region 421 (comprising a circular wire grid polarizer and a high NA lens), and closed regions 417, so that different regions of the photomask 405 transmit different types of the polarized light 401. These different regions of the photomask 405 allow multi-patterning of photoresist layer 107 due to differing types of the polarized light 401. In one embodiment, the open region 419 transmits a dose of transversely polarized light 413 (e.g., a first type of the polarized light 401), the polarized region 421 transmits a dose of longitudinally polarized light 415 (e.g., a second type of the polarized light 401), and the closed regions 417 are opaque to the polarized light 401. In one embodiment, the open region 419 is transparent to the polarized light 401 after it has been processed into transversely polarized light 413, the closed regions 117 are opaque to the polarized light 401, and the polarized region 421 is transparent to the polarized light 401 after it has been processed into longitudinally polarized light 415.

Returning now to FIG. 2A, the materials for the photomask 405 are similar to or the same as the photomask 105. In a further embodiment, the polarized region 421 includes a circular wire grid polarizer and high NA lens. In one embodiment, the polarized region 421, the waveplate 313, and the adjustable linear polarizer 311 are used in combination to control types of the light 401 transmitted through the photomask 405. One benefit of controlling the types of the light 401 is that the photoresist layer 407 may be finely tuned and adjusted in an improvised or extemporaneous manner (i.e., "on-the-fly"). In one embodiment, a polarization meter (not shown in FIG. 2A) monitors the type of the light 401 before and during the transmission onto the photoresist layer 407. The monitored information may then be provided to the adjustable linear polarizer 311, which would then compensate for fluctuations in the types of light patterning the photoresist layer 407. In this way, the photoresist layer 407 receives much fewer variations in the type of light 401 and, as a result, a much more accurate or tighter process window can be achieved (as opposed to the less accurate process windows associated with one or more currently available techniques of forming ZMVs and traces).

The use of the adjustable linear polarizer 311, the waveplate 313, and the photomask 405 can assist with reducing the development time and increasing the quality associated with fabrication of ZMVs and traces. Moreover, use of the adjustable linear polarizer 311, the waveplate 313, and the photomask 405 can assist with increasing repeatability of the process by reducing variations in the types of the light 401.

In FIG. 2A, the light 401 passing through the photomask 405 results in creation of two patterns on the photoresist layer 407. The first pattern is created using a dose of the longitudinally polarized light 415 in an area of the photoresist layer 407 under the polarized region 421 of the photomask 405. The second pattern is created using a dose of the transversely polarized light 413 in an area of the photoresist layer 407 under the open region 419 of the photomask 405.

Figure 2B:
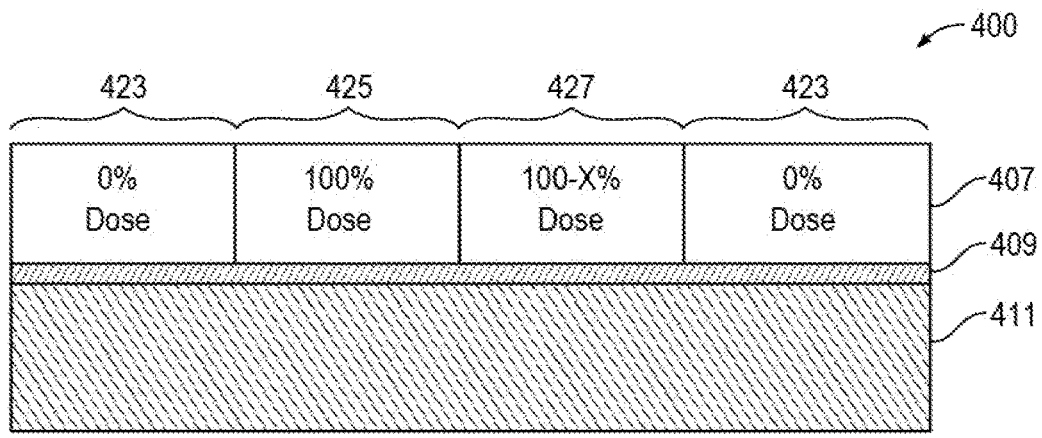

Referring now to FIG. 2B, which illustrates the package layer 400 after the photoresist layer 407 is exposed to the transversely polarized light 413 and the longitudinally polarized light 415 according to one embodiment. Following exposure to the lights 413, 415 through the photomask 405, the waveplate 313, and the adjustable linear polarizer 311, the photoresist layer 407 undergoes chemical responses that vary according to the exposure in the various regions of the resist. As shown in FIG. 2B, after the exposure, at least three 2D regions in the photoresist layer 407 are created, e.g., two regions 423, a region 425, and a region 427. In one embodiment, the region 425 represents a 2D image of a first feature (e.g., a via, or any other feature) to be formed on the dielectric layer 411; the region 427 represents a 2D image of a second feature (e.g., a trace, or any other feature adjacent to the first feature) to be formed on the dielectric layer 411. The region(s) 423 are used to protect portions of the seed layer 409 on the dielectric layer 411 from exposure. That is, at least two images of the features are created at the same time. Generally, the number of patterned regions, such as regions 423, 425 and 427, created is determined by the photoresist chemistry. In alternative embodiments, additional regions in addition to regions 423, 425 and 427 are created to pattern more than two images at a time.

As shown in FIG. 2B, each of the created regions 423, 425 and 427 has been exposed to doses of different types of polarized light 413, 415. In a non-limiting example, region(s) 423 have not been exposed to the doses of different types of polarized light 413, 415; region 425 has been exposed to a dose of longitudinally polarized light 415; and region 427 has been exposed to a dose of transversely polarized light 413. The amount of the doses of light 413, 415 can be the same or similar to each other. The amount of the doses of light 413, 415 can be different from each other.

In one non-limiting example, a region 425 is a base-soluble portion of the photoresist layer 407; regions 423 are unexposed portions of the photoresist layer 407; and region 427 is a cross-linked portion of the photoresist layer 407.

Figure 2C:
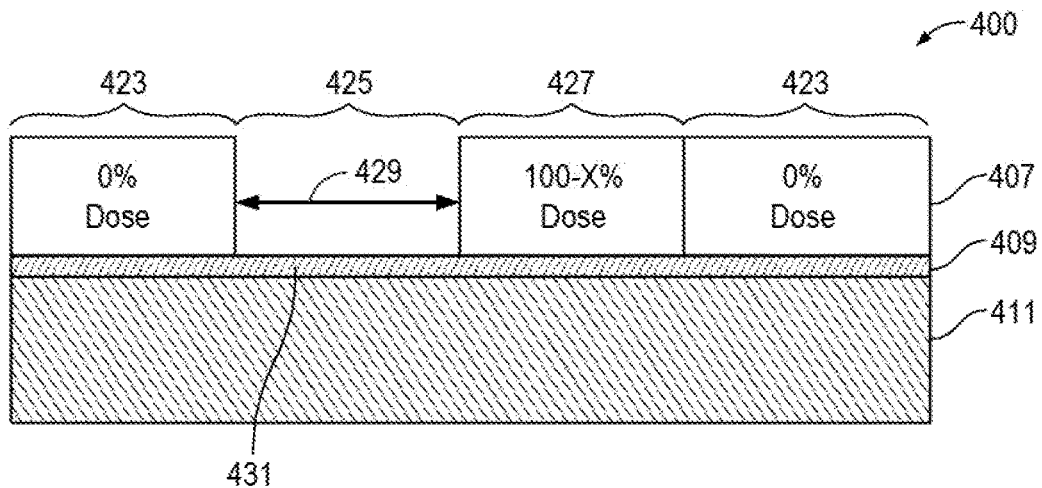

Referring now to FIG. 2C, which illustrates the package layer 400 after the region 425 of the photoresist layer 407 has been removed to uncover a top side of the seed layer 409 according to one embodiment. In one embodiment, region 425 is selectively removed by dissolution in an aqueous basic developer solution, while leaving regions 423 and 427 intact. These other regions (e.g., regions 423 and 427) remain insoluble, either due to a presence of a dissolution inhibitor (e.g., region 423, which is unexposed) or due to cross-linking (e.g., region 427). In alternative embodiments, region 425 is selectively removed using other photoresist removal techniques known to one of ordinary skill in the art of electronic device manufacturing (e.g., a dry etch technique, etc.). In one embodiment, one or more features to be formed in the region 425 comprise a via-pad structure (or ZMV). In one embodiment, the soluble region 425 is selectively removed to form one or more openings, e.g., an opening 429, to expose one or more portions of the seed layer 409, e.g., a portion 431, while leaving regions 423 and 427 intact to form one or more via-pad structures later on in the process. Opening 429 can have a circular, oval, elliptical, square, rectangular, or any other shape.

Figure 2D:
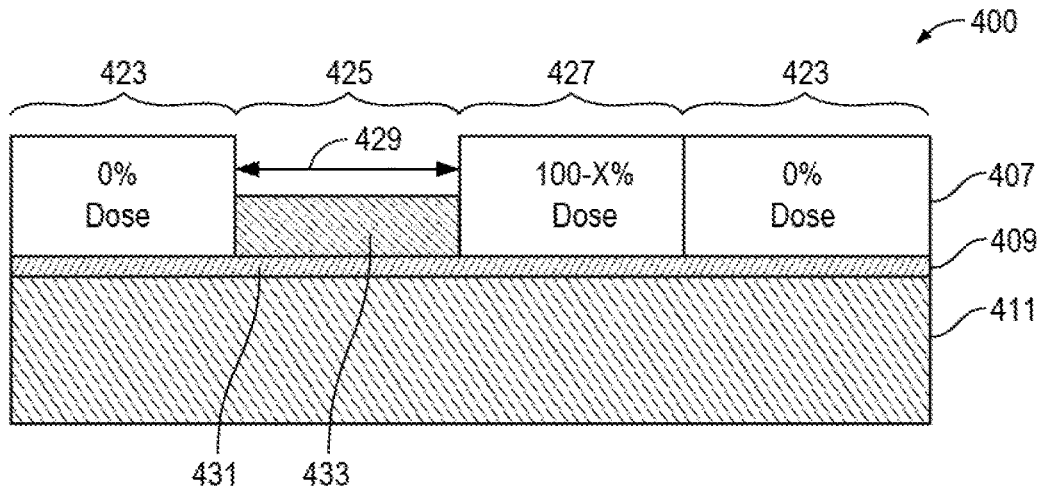

With regard now to FIG. 2D, which illustrates the package layer 400 after a first conductive layer 433 is deposited onto the uncovered top side of a portion 431 of the seed layer 409 according to one embodiment. In one embodiment, a first conductive layer 433 is a part of a via-pad structure (e.g., a ZMV). Examples of the conductive materials are described above in connection with at least FIG. 1D. In one embodiment, the conductive layer 433 is similar to or the same as the conductive layer 133 described above in connection with at least FIG. 1D, so the conductive layer 433 is not described in detail for brevity.

Figure 2E:
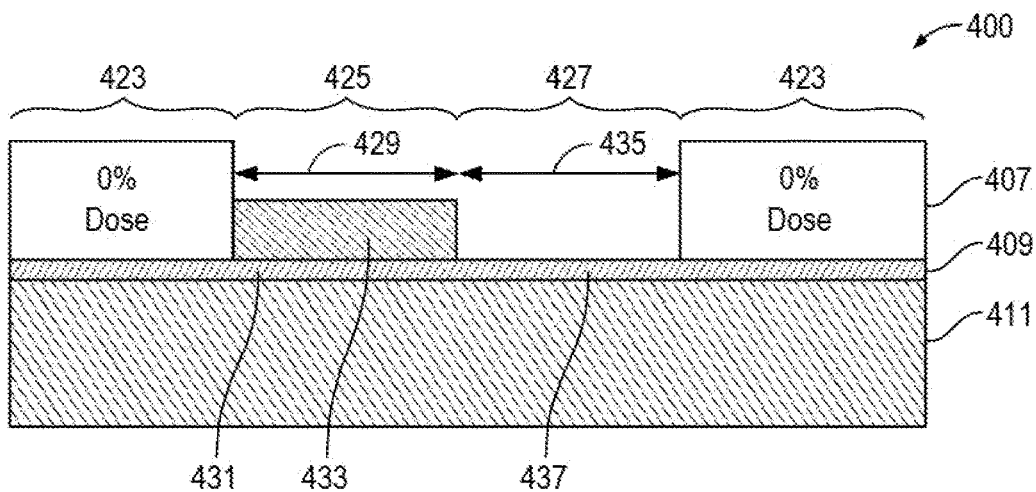

Referring now to FIG. 2E, which illustrates the package layer 400 after a region 427 of the photoresist layer 407 is removed to uncover a top side of a portion 437 of the seed layer 409 according to one embodiment. One or more features formed on the portion 437 of the seed layer 409 comprise a trace. As shown in FIG. 2E, the region 427 is selectively removed to form one or more open regions, such as open region 435 to expose one or more portions, such as a portion 437 of the seed layer 409 while leaving regions 423 of the photoresist layer 407 and conductive layer 433 intact. As shown in FIG. 2E, the conductive layer 433 is bounded by a top surface and a sidewall surface. The sidewall surface of the conductive layer 433 is exposed by removal of the region 427 of the photoresist layer 407. In one embodiment, region 427 is removed using removal techniques that are similar to or the same as the removal techniques used on region 127, so the removal of region 427 is not described in detail for brevity.

Figure 2F:
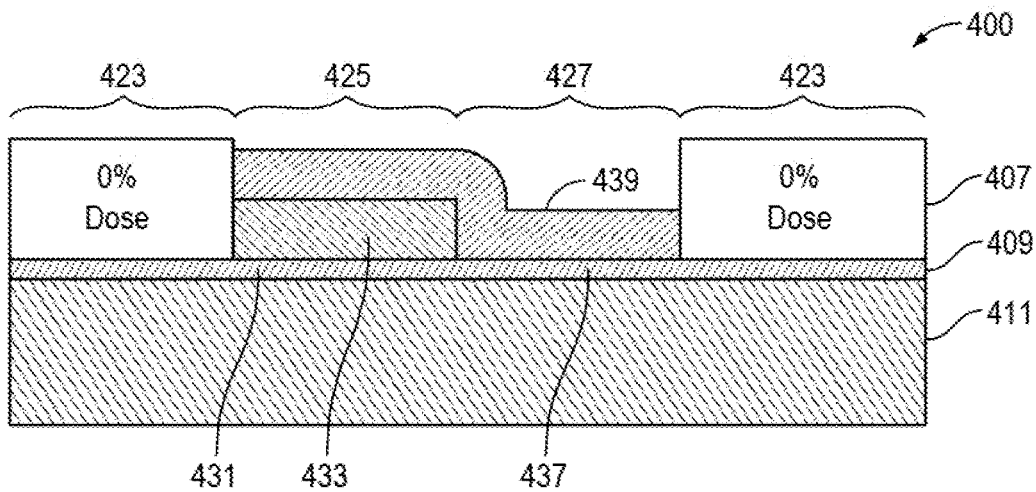

With regard now to FIG. 2F, which illustrates the package layer 400 after a second conductive layer 439 is deposited onto the first conductive layer 433 and the exposed portion 437 of the seed layer 409 according to one embodiment. As shown in FIG. 2F, a second conductive layer 439 is deposited onto the portions 437 and simultaneously on top of a first conductive layer 433. The second conductive layer 439 is similar to or the same as the second conductive layer 139 of FIGS. 1F-1G that is described above, so the second conductive layer 439 is not described in detail for brevity.

In one embodiment, where the photoresist layer 407 comprises more than three patterned regions, the remaining patterned regions are developed and a conductive layer is deposited in a manner similar to the manner described with respect to FIGS. 2A-2F. Generally, deposition of the conductive layer is additive, so each successive conductive layer deposition operation adds to the height of all uncovered conductive structures.

Figure 2G:
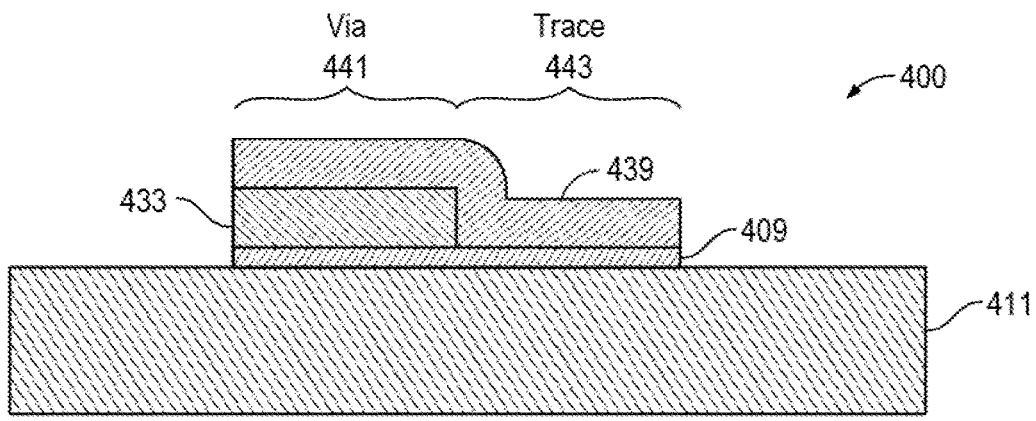

With regard now to FIG. 2G, which illustrates the package layer 400 after regions 423 of the photoresist layer 407 and portions of the seed layer 409 are removed to uncover one or more portions of the dielectric layer 411 according to one embodiment. The regions 423 are removed to expose underlying portions of the seed layer 409. Subsequently, the underlying portions of the seed layer 409 are removed to define a metal pattern. In one embodiment, the regions 423 of the photoresist layer 407 are removed using removal techniques that are similar to or the same as the removal techniques used to remove regions 123 of the photoresist layer 107 that are described above in connection with FIG. 1G. In one embodiment, the underlying portions of the seed layer 409 are removed using removal techniques that are similar to or the same the removal techniques used on the underlying portions of the seed layer 109 that are described above in connection with FIG. 1G. As shown in FIG. 2G, the via-pad structure (e.g., a ZMV, etc.) formed from the conductive layers 433 and 439 comprise a via portion 441 and a trace portion 443. The via portion 441 is similar to or the same as the via portion 141 that is described above in connection with FIG. 1G. The trace portion 443 is similar to or the same as the trace portion 143 that is described above in connection with FIG. 1G.

Figure 3:
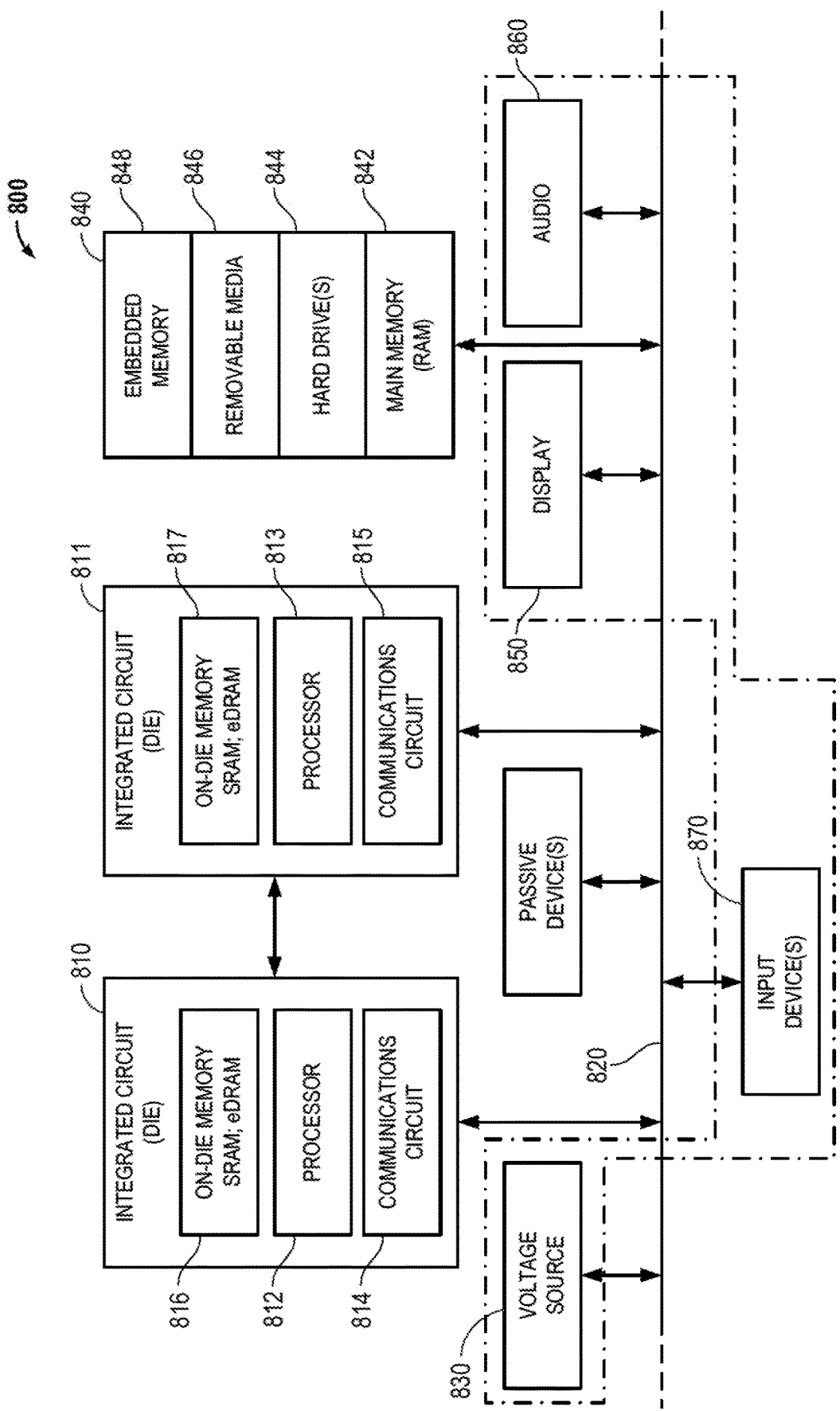
FIG. 3 is an illustration of a schematic block diagram of a computer system that utilizes a semiconductor package, according to an embodiment.

FIG. 3 illustrates a schematic of computer system 800 according to an embodiment. The computer system 800 (also referred to as an electronic system 800) can include a semiconductor package that includes at least one ZMV and/or a trace in accord with any of the embodiments and their equivalents as set forth in this disclosure. The computer system 800 may be a mobile device, a netbook computer, a wireless smart phone, a desktop computer, a hand-held reader, a server system, a supercomputer, or a high-performance computing system.

The electronic system 800 can be a computer system that includes a system bus 820 to electrically couple the various components of the electronic system 800. The system bus 820 is a bus or any combination of busses according to various embodiments. The electronic system 800 includes a voltage source 830 that provides power to the integrated circuit 810. In one embodiment, the voltage source 830 supplies current to the integrated circuit 810 through the system bus 820.

The integrated circuit 810 is electrically coupled to the system bus 820 and includes any circuit, or combination of circuits according to an embodiment. For an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. For an embodiment, the processor 812 includes, or is coupled with, a semiconductor package that includes at least one ZMV and/or a trace in accord with any of the embodiments and their equivalents, as described in the foregoing specification. For an embodiment, static random-access memory (SRAM) embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. For an embodiment, the integrated circuit 810 includes on-die memory 816 such as SRAM. For an embodiment, the integrated circuit 810 includes embedded on-die memory 816 such as embedded dynamic random-access memory (eDRAM). For one embodiment, the on-die memory 816 may be packaged with a process that includes one or more embodiments of protection against galvanic corrosion in accord with any of the embodiments and their equivalents, as described in the foregoing specification.

For an embodiment, the integrated circuit 810 is complemented with a subsequent integrated circuit 811. Useful embodiments include a dual processor 813 and a dual communications circuit 815 and dual on-die memory 817 such as SRAM. For an embodiment, the dual integrated circuit 810 includes embedded on-die memory 817 such as eDRAM.

For an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

For an embodiment, the electronic system 800 also includes a display device 850 and an audio output 860. For an embodiment, the electronic system 800 includes an input device such as a controller 870 that may be a keyboard, mouse, trackball, game controller, microphone, voice-recognition device, or any other input device that inputs information into the electronic system 800. For an embodiment, an input device 870 is a camera. For an embodiment, an input device 870 is a digital sound recorder. For an embodiment, an input device 870 is a camera and a digital sound recorder.

At least one of the integrated circuits 810 or 811 can be implemented in a number of different embodiments, including a semiconductor package that includes at least one ZMV and/or a trace as described herein, an electronic system, a computer system, one or more methods of fabricating an integrated circuit, and one or more methods of fabricating an electronic assembly that includes a semiconductor package that includes at least one ZMV and/or a trace, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the semiconductor packages that includes at least one ZMV and/or a trace in accordance with any of the several disclosed embodiments as set forth herein and their art-recognized equivalents. A foundation substrate may be included, as represented by the dashed line of FIG. 3. Passive devices may also be included, as is also depicted in FIG. 3.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or Figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semi conductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures.

Embodiments described herein include a method of forming a semiconductor package, the method comprising: depositing a photoresist layer on a seed layer that is on a dielectric layer, wherein the photoresist layer comprises dual-tone photoresist materials; removing a first region of the photoresist layer to uncover a first portion of the seed layer to form a zero misalignment-via (ZMV), wherein the first region of the photoresist layer is exposed to a first dose of light; depositing a first conductive layer onto the first portion; removing a second region of the photoresist layer adjacent to the first region to uncover a second portion of the seed layer to form a trace, wherein the second region of the photoresist layer is exposed to a second dose of light that differs from the first dose of light; and depositing a second conductive layer onto the first conductive layer and the second portion of the seed layer.

Additional embodiments include a method, wherein the light is processed by an adjustable polarizer and a photomask to generate polarized light.

Additional embodiments include a method, wherein the adjustable polarizer comprises one or more of: one or more linear polarizers; and one or more circular polarizers.

Additional embodiments include a method, wherein the photomask comprises one or more gray-scale masks.

Additional embodiments include a method, wherein the photomask comprises: a first region that prevents the polarized light from passing through the photomask; a second region comprising a polarizer that allows varying doses of the polarized light to pass through the photomask; and a third region that allows a fixed dose of the polarized light to pass through the photomask.

Additional embodiments include a method, wherein the first dose is the fixed dose.

Additional embodiments include a method, wherein the second dose is selected from one or more of the varying doses.

Additional embodiments include a method, wherein the photoresist layer is formed from a positive resist material.

Embodiments described herein include a method of forming a semiconductor package, the method comprising: depositing a photoresist layer on a seed layer that is on a dielectric layer, wherein the photoresist layer comprises dual-tone photoresist materials; removing a first region of the photoresist layer to uncover a first portion of the seed layer to form a zero misalignment-via (ZMV), wherein the first region of the photoresist layer is exposed to a first type of light; depositing a first conductive layer onto the first portion; removing a second region of the photoresist layer adjacent to the first region to uncover a second portion of the seed layer to form a trace, wherein the second region of the photoresist layer is exposed to a second type of light that differs from the first type of light; and depositing a second conductive layer onto the first conductive layer and the second portion of the seed layer.

Additional embodiments include a method, wherein the light is processed by an adjustable polarizer, a waveplate, and a photomask to generate transversely polarized light and longitudinally polarized light.

Additional embodiments include a method, wherein the adjustable polarizer comprises one or more linear polarizers for generating the transversely polarized light.

Additional embodiments include a method, wherein the waveplate processes the transversely polarized light to generate circular polarized light.

Additional embodiments include a method, wherein the photomask comprises: a first region that prevents the polarized light from passing through the photomask; a second region comprising a circular wire grid polarizer and a numerical aperture lens that processes the circular polarized light to generate the longitudinally polarized light, wherein the second region allows the longitudinally polarized light to pass through the photomask; and a third region that allows the transversely polarized light to pass through the photomask.

Additional embodiments include a method, wherein the first type of light is the longitudinally polarized light.

Additional embodiments include a method, wherein the second type of light is the transversely polarized light.

Additional embodiments include a method, wherein the photoresist layer is formed from a positive resist material.

Additional embodiments include a method, wherein the photoresist layer is formed from a polarization-selective resist material.

Additional embodiments include a method, wherein the light comprises longitudinally polarized light and transversely polarized light and wherein the photoresist layer is more sensitive to the longitudinally polarized light than the transversely polarized light.

Embodiments described herein include a method of forming a semiconductor package, the method comprising: depositing a photoresist layer on a seed layer that is on a dielectric layer, wherein the photoresist layer comprises dual-tone photoresist materials; removing a first region of the photoresist layer to expose a first portion of the seed layer to form a zero misalignment-via (ZMV), wherein the first region of the photoresist layer is exposed to longitudinally polarized light; depositing a first conductive layer onto the first portion; removing a second region of the photoresist layer adjacent to the first region to expose a second portion of the seed layer to form a trace, wherein the second region of the photoresist layer is exposed to transversely polarized light; and depositing a second conductive layer onto the first conductive layer and the second portion of the seed layer.

Additional embodiments include a method, wherein the photoresist layer is formed from a polarization-selective resist material and wherein the photoresist layer is more sensitive to the longitudinally polarized light than the transversely polarized light.

As used herein, "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together.

The terms used in the following claims should not be construed to limit any of the embodiments described in connection with the foregoing specification, abstract, and/or Figures to the specific embodiments set forth in the foregoing specification, abstract, Figures, and/or claims. Rather, the scope of the claims are to be construed in accordance with established doctrines of claim interpretation.

What is claimed is:

1. A method of forming a semiconductor package, the method comprising:
depositing a photoresist layer on a seed layer that is on a dielectric layer, wherein the photoresist layer comprises dual-tone photoresist materials;
removing a first region of the photoresist layer to uncover a first portion of the seed layer to form a zero misalignment-via (ZMV), wherein the first region of the photoresist layer is exposed to a first dose of light;
depositing a first conductive layer onto the first portion;
removing a second region of the photoresist layer adjacent to the first region to uncover a second portion of the seed layer to form a trace, wherein the second region of the photoresist layer is exposed to a second dose of light that differs from the first dose of light, and wherein the second dose of light and the first dose of light are provided during a same exposure; and
depositing a second conductive layer onto the first conductive layer and the second portion of the seed layer.

2. The method of claim 1, wherein each of the first and second doses of light is processed by an adjustable polarizer and a photomask to generate polarized light.

3. The method of claim 2, wherein the adjustable polarizer comprises one or more of: one or more linear polarizers; and one or more circular polarizers.

4. The method of claim 2, wherein the photomask comprises one or more gray-scale masks.

5. The method of claim 4, wherein the photomask comprises:
a first region that prevents the polarized light from passing through the photomask;
a second region comprising a polarizer that allows one or more varying doses of the polarized light to pass through the photomask; and
a third region that allows a fixed dose of the polarized light to pass through the photomask.

6. The method of claim 5, wherein the first dose of light is the fixed dose of the polarized light.

7. The method of claim 5, wherein the second dose of light is selected from one or more of the varying doses of polarized light.

8. The method of claim 1, wherein the photoresist layer is formed from a positive resist material.

9. The method of claim 1, further comprising:
monitoring, using an intensity meter, an intensity of the first dose of light and an intensity of the second dose of light.

10. The method of claim 9, further comprising:
providing the measured intensities of the first and second doses of light to the adjustable polarizer, wherein the adjustable polarizer compensates for intensity fluctuations associated with the first and second doses of light.

11. The method of claim 1, wherein an intensity of the first dose of light is higher than an intensity of the second dose of light.

12. The method of claim 1, wherein an intensity of the first dose of light is lower than an intensity of the second dose of light.

13. A method of forming a semiconductor package, the method comprising:
- depositing a photoresist layer on a seed layer that is on a dielectric layer, wherein the photoresist layer comprises dual-tone photoresist materials;
- removing a first region of the photoresist layer to uncover a first portion of the seed layer to form a zero misalignment-via (ZMV), wherein the first region of the photoresist layer is exposed to a first dose of light and wherein the first region of the photoresist layer is a base-soluble portion of the photoresist layer;
- depositing a first conductive layer onto the first portion;
- removing a second region of the photoresist layer adjacent to the first region to uncover a second portion of the seed layer to form a trace, wherein the second region of the photoresist layer is exposed to a second dose of light that differs from the first dose of light, and wherein the second dose of light and the first dose of light are provided during a same exposure; and
- depositing a second conductive layer onto the first conductive layer and the second portion of the seed layer.

14. The method of claim 13, wherein removing the first region of the photoresist layer to uncover the first portion of the seed layer to form a ZMV comprises: dissolving the first region of the photoresist layer using an aqueous basic developer solution in response to exposing the first region of the photoresist layer to the first dose of light.

15. The method of claim 13, wherein removing the first region of the photoresist layer to uncover the first portion of the seed layer to form a ZMV comprises: etching the first region of the photoresist layer using a dry etching technique in response to exposing the first region of the photoresist layer to the first dose of light.

16. A method of forming a semiconductor package, the method comprising:
- depositing a photoresist layer on a seed layer that is on a dielectric layer, wherein the photoresist layer comprises dual-tone photoresist materials;
- removing a first region of the photoresist layer to uncover a first portion of the seed layer to form a zero misalignment-via (ZMV), wherein the first region of the photoresist layer is exposed to a first dose of light;
- depositing a first conductive layer onto the first portion;
- removing a second region of the photoresist layer adjacent to the first region to uncover a second portion of the seed layer to form a trace, wherein the second region of the photoresist layer is exposed to a second dose of light that differs from the first dose of light and wherein the second region of the photoresist layer is a cross-linked portion of the photoresist layer, and wherein the second dose of light and the first dose of light are provided during a same exposure; and
- depositing a second conductive layer onto the first conductive layer and the second portion of the seed layer.

17. The method of claim 16, further comprising: treating the second region of the photoresist layer using a flood exposure technique, a heating technique, or one or more chemicals.

18. The method of claim 17, wherein treating the second region of the photoresist layer is performed before, during, or after depositing the first conductive layer onto the first portion.

19. The method of claim 16, wherein depositing the second conductive layer onto the first conductive layer and the second portion of the seed layer is performed using an isotropic process or an anisotropic process.

20. The method of claim 16, wherein removing the second region of the photoresist layer adjacent to the first region to uncover the second portion of the seed layer to form the trace comprises:
- dissolving the second region of the photoresist layer using an organic solvent or an aqueous basic developer solution in response to exposing the second region of the photoresist layer to the second dose of light.

\* \* \* \* \*